United States Patent [19]

Iida

[11] Patent Number: 5,427,826
[45] Date of Patent: Jun. 27, 1995

[54] METHOD FOR FORMING A SUPERHARD CARBONACEOUS PROTECTIVE FILM ON ARTICLES

[75] Inventor: Tamaki Iida, Tokyo, Japan

[73] Assignee: Shin-Etsu Chemical Co., Ltd., Tokyo, Japan

[21] Appl. No.: 314,682

[22] Filed: Sep. 29, 1994

[30] Foreign Application Priority Data

Mar. 17, 1994 [JP] Japan .................................. 6-046898

[51] Int. Cl.⁶ .............................................. B05D 3/06
[52] U.S. Cl. ..................................... 427/575; 427/249; 427/577
[58] Field of Search .................. 427/249, 575, 577

*Primary Examiner*—Bernard Pianalto
*Attorney, Agent, or Firm*—Wenderoth, Lind & Ponack

[57] ABSTRACT

Proposed is an improvement in the process for forming a superhard carbonaceous coating film on various articles by the plasma-induced CVD method using an apparatus in which microwaves generated in an oscillator are introduced into the CVD chamber through a waveguide duct partitioned from the CVD chamber by a gas shield. In the apparatus used according to the invention, a microwave-barrier diaphragm having an orifice of a limited open area is provided between the gas shield in the waveguide duct and the CVD chamber to form a plasma-generating zone between the gas shield and the microwave-barrier diaphragm so that the intensity of the microwaves directly entering the CVD chamber is so limited that the carbonaceous coating film deposited on the substrate surface can be imparted with greatly increased luster and clarity along with an advantage that the substrate article is subjected to less thermal damage by virtue of the decreased temperature elevation by virtue of the limited intensity of the microwaves reaching the substrate.

6 Claims, 2 Drawing Sheets

METHOD FOR FORMING A SUPERHARD CARBONACEOUS PROTECTIVE FILM ON ARTICLES

BACKGROUND OF THE INVENTION

The present invention relates to a method for the formation of a superhard protective film of a carbonaceous material on the surface of a variety of articles. More particularly, the invention relates to an improvement in a plasma-induced chemical vapor-phase deposition (CVD) method for the formation of a superhard carbonaceous protective film on the surface of various kinds of substrate articles such as personal ornamental goods, by which the protective film can be imparted with excellent properties without affecting the substrate material even when the substrate material has relatively low resistance against the atmosphere and temperature of plasma.

Needless to say, various kinds of personal ornamental articles as jewelry, such as rings, pendants, earrings, necklaces, bracelets, brooches, necktie pins, cuff buttons and the like, are made from noble metals such as silver, gold, platinum and the like sometimes in combination with pearls and gemstones although imitation jewelry can be prepared from less expensive materials such as non-noble metals and alloys thereof, glass and ceramics, plastic resins and so on. While it is a matter of course in these ornamental articles that the beautiful appearance or, in particular, the high luster is desired to be everlasting or at least not subject to a decrease over years as long as possible, an unavoidable problem therein is that, excepting for diamonds and the like having the highest hardness and highest chemical stability, the luster of the surface is gradually decreased due to scratches and discoloration taking place by the atmospheric influences in the course of their fabrication or during prolonged wearing in direct contact with human skin resulting in lessening of their aesthetic value. In addition, some of metals act as an allergen to cause an allergic dermatitis on the human skin of some people prolongedly kept in direct contact therewith. It is also reported that quality degradation of these jewelry articles is unavoidable more or less even when the article is merely kept within a showcase or show window of a jewelry shop because the article there is usually under strong illumination with fluorescent lamps emitting ultraviolet light. Besides, certain glass- or plastic-made optical articles such as eye glasses as well as contact lenses are desired to everlastingly maintain the clarity which is sometimes decreased due to occurrence of scratches during their prolonged use.

Various proposals have been made in the prior art to solve the above mentioned problems by providing a transparent protective coating film of a carbonaceous material having an extremely high hardness approaching that of diamond. While such a carbonaceous coating film can be deposited on the substrate surface by the so-called thermal or plasma-induced chemical vapor-phase deposition (CVD) method in which a gaseous mixture of a hydrocarbon compound and hydrogen is decomposed to isolate carbon which is deposited on the substrate surface forming a film thereon, none of the CVD methods heretofore proposed can be practically applied to jewelry articles because the low clarity of the thus formed coating film may decrease the aesthetic value of the article and, even worse, denaturation is sometimes caused in the substrate surface as a consequence of the atmospheric conditions and temperature in the CVD process which are not mild enough to ensure stability of the material of the articles.

For example, Japanese Patent Kokai 58-91100 teaches a thermal CVD method for the deposition of a superhard carbonaceous protective film in which a gaseous mixture of a hydrocarbon compound and hydrogen is brought into contact with the surface of a substrate kept at a high temperature of 500° C. or higher so as to effect thermal decomposition of the hydrocarbon compound on the substrate surface to isolate elementary carbon. Further, Japanese Patent Kokai 58-110494 teaches a plasma-induced CVD method in which a gaseous mixture of a hydrocarbon compound and hydrogen is passed through the field of electrodeless discharge caused by microwaves to generate plasma which is brought into contact with the surface of a substrate heated at a temperature of 300° C. or higher so as to effect plasma-induced decomposition of the hydrocarbon compound on the substrate surface to isolate elementary carbon which is deposited on the substrate surface forming a film. In this prior art method, the microwaves generated in a microwave oscillator are introduced through a waveguide duct into a reaction chamber in which the hydrocarbon compound at an appropriate low pressure is converted into plasma and decomposed thereby to deposit a carbonaceous film having a hardness approaching that of diamond. The microwaves introduced into the reaction chamber serve also to heat the substrate by the electromagnetic induction.

These prior art CVD methods are limited relative to the material of the substrate article and not applicable to most of the jewelry articles because of the low clarity of the thus deposited carbonaceous films or discoloration of the substrate surface. In the conventional thermal CVD method, the temperature of the substrate surface sometimes exceeds 730° C. so that, when the article is made from a 22-karat gold alloy, a loss is caused in the luster of the article. When an opal is subjected to the conventional plasma CVD method, discoloration or loss of luster is unavoidable on the surface of the opal as a consequence of the excessively high temperature at which the substrate is subjected to the plasma-induced deposition of the carbonaceous film.

SUMMARY OF THE INVENTION

The present invention accordingly has an object to provide an improvement in the plasma-induced CVD method for the deposition of a superhard carbonaceous protective film on the surface of various kinds of substrate bodies or, in particular, personal ornamental articles, by virtue of which the CVD method is applicable to the substrate of any materials irrespective of the thermal stability of the material and is capable of giving a carbonaceous protective film of high clarity not to affect the aesthetic value of the ornamental article.

Thus, the present invention provides, in a method for forming a superhard carbonaceous coating film on the surface of an article by the plasma-induced chemical vapor-phase deposition (CVD) process in an apparatus comprising a microwave oscillator to generate microwaves, a plasma-induced CVD chamber into which a hydrocarbon compound in a gaseous form is introduced and in which plasma of the gas is generated to effect deposition of a carbonaceous film on the surface of an article held therein, and a waveguide duct partitioned from the CVD chamber by a gas-shield, through which the microwaves generated in the microwave oscillator are introduced into the CVD chamber, an improvement which comprises providing a microwave-barrier diaphragm or wall having an orifice between the gas shield in the waveguide duct and the CVD chamber to form a plasma-generating zone therebetween so as to limit the microwaves directly entering the CVD chamber.

DETAILED DESCRIPTION OF THE PREFERRED EMBODIMENTS

As is understood from the above given description, the very feature of the improvement provided by the present invention consists in the use of a CVD apparatus having a specific design which is novel and not known in the art of plasma-induced CVD processes in the prior art. Namely, the microwaves generated by a microwave oscillator are introduced into the CVD chamber through a waveguide duct not directly but as limited by a microwave-barrier diaphragm having an orifice so that only a part of the microwaves enters the CVD chamber to prevent the article under treatment from excessive heating and to moderate the conditions for the plasma-induced decomposition of the hydrocarbon compound and deposition of the isolated carbon.

The material of the articles to which the plasma-induced CVD process is applied according to the present invention is not particularly limitative and, in particular, is free from the limitations in respect of the heat resistance of the material because the substrate article for the coating treatment is never heated excessively as a consequence of the inventive improvement. Assuming that the substrate article under treatment is a personal ornamental article which may be a genuine jewelry or an imitation, examples of the material include metals such as silver, gold, platinum, nickel, chromium and the like and alloys thereof, ceramic materials such as alumina, titanium nitride, various grades of glass and the like and polymeric resins such as polymethyl methacrylate, polyimide resins and the like as well as precious and semi-precious stones including pearls, opals, rubies, sapphires, emeralds quartz crystals, garnets, jadeites, cat's-eyes, ambers, amethysts, turquois, peridots and the like. The improvement obtained according to the present invention is particularly remarkable when these precious and semi-precious stones are treated.

Figure 1:
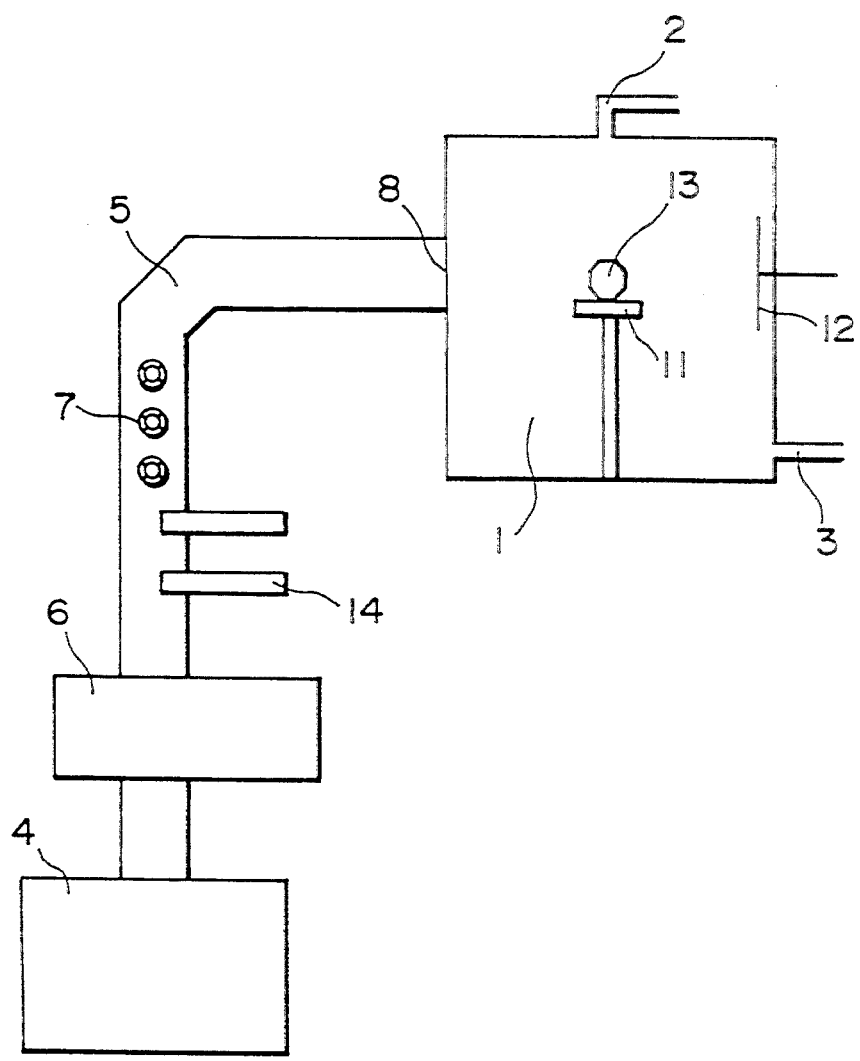
FIG. 1 is a schematic cross sectional view of an apparatus for conducting the plasma-induced CVD process according to a conventional method.

FIG. 1 is a schematic cross sectional view of an apparatus used in a conventional CVD process for the formation of a superhard carbonaceous coating film on the surface of a substrate made from the above mentioned materials. In this apparatus, microwaves having a frequency of 1000 MHz to 3000 MHz are generated in the microwave oscillator 4 and, after passing the isolator 6, are introduced into the CVD chamber 1 as guided by the waveguide duct 5 having a power detector 14 and a matching zone 7. In the CVD chamber 1, the substrate article 13 is mounted on the substrate table 11. While the CVD chamber 1 is filled with a reactant gas such as a mixture of a hydrocarbon compound, e.g., methane and ethane, and hydrogen introduced through the gas inlet tube 2, the pressure inside the CVD chamber is controlled at a low pressure suitable for generation of plasma by the balance of continuous gas introduction and continuous evacuation through the evacuation duct 3 connected to an evacuation system such as a vacuum pump (not shown in the figure). The waveguide duct 5 and the CVD chamber 1 are partitioned each from the other by means of a gas shield 8 made from a material such as fused silica glass, ceramics, fluorocarbon resins, e.g., polytetrafluoroethylene resins, and the like which allows permeation of the microwaves into the CVD chamber 1 but prevents the reactant gas filling the CVD chamber 1 from entering the waveguide duct 5 so that plasma of the reactant gas is generated in the CVD chamber 1 by means of the microwaves having an adequate intensity or distribution to cause glow discharge by means of the plunger 12. The above mentioned gas shield 8 has a thickness, though dependent on the material, in the range from 2 to 10 mm or, preferably, from 4 to 8 mm in consideration of the balance between the permeability of the microwaves and mechanical strengths to withstand the pressure difference between the surfaces.

Figure 2:
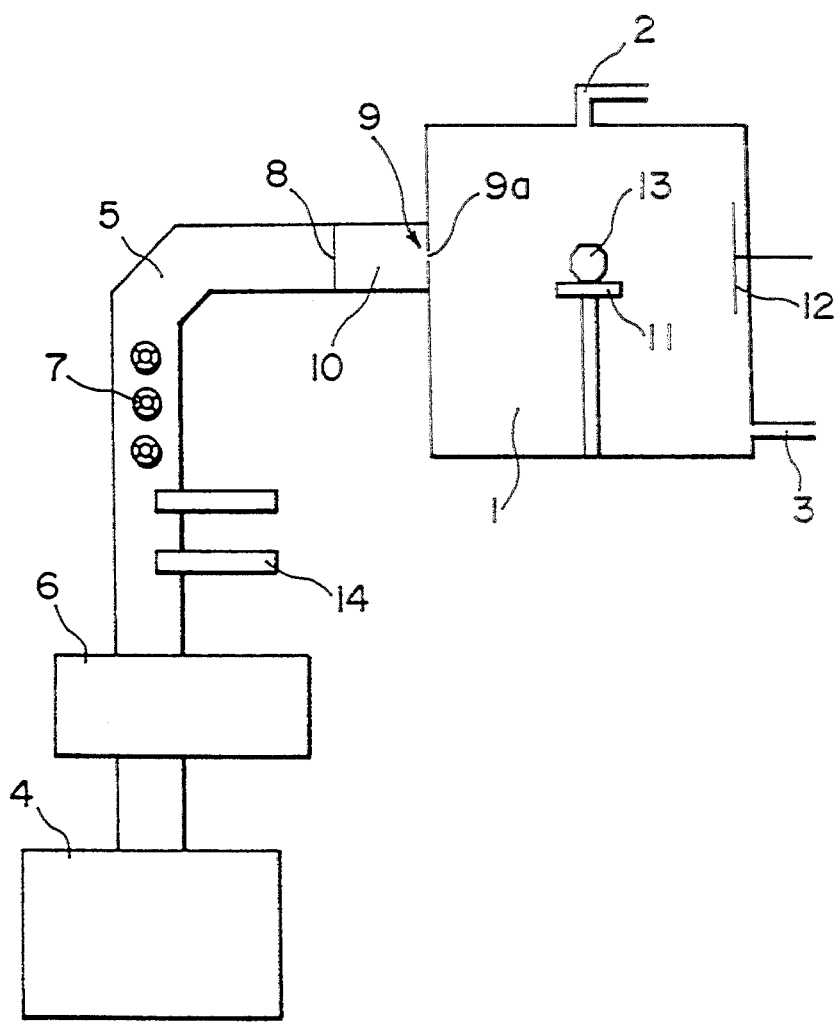
FIG. 2 is a schematic cross sectional view of an apparatus for conducting the plasma-induced CVD process according to the present invention.

The CVD process according to the improvement of the present invention is now described by making reference to FIG. 2 which illustrates a schematic cross sectional view of the apparatus used in the CVD process according to the invention. As is shown in FIG. 2, the structure of the apparatus used in the invention is generally the same as that of the conventional apparatus illustrated in FIG. 1 excepting an important modification. Namely, the gas shield 8, which partitions the waveguide duct 5 and the CVD chamber just at the border plane therebetween in FIG. 1, is provided not at the border plane but at a distance therefrom toward the waveguide duct 5. Instead, a microwave-barrier diaphragm 9 having an orifice 9a is installed on the border plane between the waveguide duct 5 and the CVD chamber 1 to form a compartment 10, which serves as a plasma-generating zone, between the gas shield 8 and the microwave-barrier diaphragm 9.

Since the microwave-barrier diaphragm 9 is made from a microwave-impermeable material such as metallic materials, e.g., stainless steel and aluminum, and certain ceramics, of which stainless steel is preferred, and has a thickness of 1 to 5 mm or, preferably, 1 mm to 3 mm, the microwaves reaching the compartment 10 are mostly confined within the compartment 10 and only a part of the microwaves can pass through the orifice 9a into the CVD chamber 1 while the reactant gas in the CVD chamber 1 can freely diffuse through the orifice 9a into the compartment 10 where the plasma of the reactant gas is generated by the microwaves confined therein. The reactant gas such as methane is decomposed in the atmosphere of plasma inside the compartment 10 to serve as a plasma-generating zone into free carbon, i.e. precursor of soot, CH radicals, $CH_2$ radicals, $CH_3$ radicals, hydrogen atoms and the like but the free carbon produced in the plasma-generating zone 10 is little transferred into the CVD chamber 1 as barriered by the diaphragm 9 while the CH radicals, $CH_2$ radicals, $CH_3$ radicals and hydrogen atoms can enter the CVD chamber 1 relatively easily through the orifice 9a to pertain to the plasma-induced deposition of a carbonaceous film on the surface of the substrate 13. On the other hand, the microwaves partly passing through the orifice 9a enter the CVD chamber 1 where plasma is generated but in a moderate intensity as a consequence of the controlled intensity of the microwaves by virtue of the microwave-barrier diaphragm 9 and the plunger 12. Accordingly, the surface of the substrate article 13 mounted on the substrate table 11, on which a carbonaceous film is to be deposited, is greatly freed from deposition of soot thus to ensure high clarity of the deposited carbonaceous film. Though dependent on the wavelength of the microwaves and other factors, the distance between the gas shield 8 and the microwave-barrier diaphragm 9 is in the range from 90 mm to 120 mm and is approximately the same as the width of the gas shield 8 in order to obtain adequate introduction of the microwaves into the CVD chamber 1.

As is readily understood in consideration of the role played by the microwave-barrier diaphragm 9 with an orifice 9a, which serves to divide the microwaves into two portions including, on one hand, that confined within the plasma-generating zone 10 and, on the other hand, that entering the CVD chamber 1, configuration of the orifice 9a and the aperture ratio, i.e. the ratio of the area of the orifice 9a to the cross sectional area of the waveguide duct 5, are important factors affecting the results of the CVD process according to the invention. In this regard, the inventors have conducted extensive experimental tests leading to the establishment of the present invention. According to the results of the investigations, it has been established that the orifice 9a should have an area which is in the range from 0.1 to 1.2% or, preferably, from 0.3 to 1.0% of the cross sectional area of the waveguide duct 5 and it is preferable that the orifice 9a has a circular form or an elliptic form with the longer axis in the horizontal direction and the shorter axis in the vertical direction. The ratio of the lengths of the longer axis to the shorter axis should not exceed 8:4 or, preferably, 8:5 when the orifice 9a has an elliptic form. When these requirements are satisfied, the temperature of the substrate article 13 rarely exceeds 200° C. to ensure stability of the substrate article 13 even when the material thereof has relatively low heat resistance. On the other hand, the rate of deposition of the carbonaceous film on the substrate surface is unduly decreased when the aperture ratio of the orifice 9a is too small due to the excessively barriered intercommunication between the plasma-generating zone 10 and the CVD chamber 1 for the microwaves as well as for the species in the plasma produced from the reactant gas to pertain to the deposition of the carbonaceous film while, when the aperture ratio of the orifice 9a is too large, the quality of the carbonaceous film deposited on the substrate surface is badly affected.

To describe the CVD process according to the present invention in more detail, the substrate article 13 is mounted on the substrate table 11 in the CVD chamber 1 followed by evacuation of the chamber 1 through the evacuation duct 3 connected to an evacuation system (not shown in the figures), with the gas inlet tube 2 closed, down to a pressure of 0.01 mbar or lower. Thereafter, a gaseous mixture of a hydrocarbon compound, such as methane, ethane and propane, as the reactant gas and a carrier gas, such as hydrogen and argon, in a mixing ratio of 7:93 to 25:75 by volume is continuously introduced into the CVD chamber 1 through the gas-inlet tube 2 to establish a pressure of 0.05 to 0.5 mbar inside the CVD chamber 1 by the balance with continued evacuation through the evacuation duct 3. After establishment of the stationary atmospheric conditions inside the CVD chamber 1, electric power is supplied to the magnetron microwave oscillator 4 to generate microwaves of a frequency in the range from 1000 MHz to 3000 MHz which are guided through the waveguide duct 5 partly entering the CVD chamber 1 through the orifice 9a. The reactant gas filling the CVD chamber 1 enters the plasma-generating zone 10 through the orifice 9a and decomposed there by the plasma induced by the microwaves to produce carbon-containing free radicals and hydrogen atoms which in turn are transferred into the CVD chamber 1 through the orifice 9a to pertain to the deposition of the carbonaceous film on the substrate surface.

As is mentioned above, the frequency of the microwaves is preferably in the range from 1000 MHz to 3000 MHz because, when the frequency is too low, the rate of deposition of the carbonaceous film is decreased while, when the frequency is too high, difficulties are encountered in obtaining stable impedance matching of the apparatus. More preferably, the frequency is in the range from 1500 MHz to 2500 MHz in order to obtain stability of the glow discharge. Further, the volume ratio of the hydrocarbon gas and the carrier gas, which is, preferably, hydrogen, is, as is mentioned above, in the range from 7:93 to 25:75 or, preferably, in the range from 10:90 to 18:82 because, when the volume ratio of the hydrocarbon gas is too small, the amount of soot formation is increased while, when the volume ratio thereof is too large, a decrease is caused in the hardness of the carbonaceous film deposited on the substrate surface.

Although the temperature in the plasma-generating zone 10 sometimes reach 700° to 1200° C. under generation of plasma, the temperature of the substrate article 13 on the substrate table 11 can be controlled not to exceed 200° C. by suitably selecting the aperture ratio of the orifice 9a in the microwave-barrier diaphragm 9 so that the substrate article 13 is safe from any thermal damages even when the material thereof is not highly heat-resistant. In particular, it is preferable that the temperature of the substrate article is controlled in the range from 150° to 200° C. when the material thereof is a metal or an alloy and in the range from 80° to 100° C. when the substrate article is a gemstone such as pearls, opals, emeralds and the like. Control of the substrate temperature can be performed by suitably selecting the aperture ratio as well as the form of the orifice 9a. For example, a higher substrate temperature can be obtained by increasing the ratio of the lengths of the longer axis to the shorter axis so that the orifice 9a has a form of a somewhat elongated ellipse.

When the above described requirements for the various conditions are satisfied, a superhard carbonaceous film having excellent properties can be obtained with an increase of the thickness at a rate of 0.1 to 0.5 μm per hour. The overall thickness of the superhard carbonaceous protective film is usually in the range from 0.01 to 1.0 μm though dependent on various factors such as the material of the substrate article 13 and the intended application thereof. When the substrate article 13 is a jewelry article, in particular, a thickness in the range from 0.02 to 0.5 μm is preferred in view of the balance between the desired good protective effect and the influence by the carbonaceous film on the aesthetic appearance of the article.

In the following, the advantages obtained by the improvement according to the present invention are illustrated in more detail by way of examples and a comparative example which, however, never limit the scope of the invention in any way. The articles provided with a carbonaceous coating film in the following examples and comparative example were subjected to the evaluation test for the items given below by the respective testing procedures described there.

(1) Abrasion resistance:

Using a disc-type kinematic abrasion tester (manufactured by Shinto Kagaku Co.), the surface of the sample was rubbed with a cotton cloth for men's shirts at 150 rpm under a load of 50 g and the surface was examined on a stereomicroscope of 5 times magnification for the appearance of scratches and wearing.

(2) Weatherability:

The sample was kept for 30 days in an atmosphere of 90% relative humidity at 80° C. and visual inspection was performed for discoloration or any other changes caused on the surface.

(3) Ultraviolet resistance:

The sample was irradiated for 30 days with ultraviolet light at a distance of 20 cm from the ultraviolet lamp in an ultraviolet irradiation tester and visual inspection was performed for discoloration or any other changes caused on the surface.

(4) Luster:

Measurement of the luster was performed by using a goniometric gloss meter (manufactured by Nippon Denshoku Co.) with a mirror-polished semiconductor silicon wafer as the reference surface. The result was recorded by the difference in % in the light reflectivity between the sample surface and the reference surface.

(5) Heat cycle test:

The sample was subjected to 100 times repeated cycles each consisting of keeping at −20° C. for 10 minutes in a freezer and keeping at 100° C. for 10 minutes in a drying oven and visual inspection was performed for discoloration or any other changes caused on the surface.

(6) Solvent resistance:

The sample was immersed for 5 minutes at room temperature in a bath of ethyl alcohol, acetone or gasoline and visual inspection was performed after 10 days therefrom for discoloration or any other changes caused on the surface.

(7) Clarity:

Absorbance by the carbonaceous coating film was determined for visual light of 400 to 750 nm wavelength by using a UV-IR absorption spectrophotometer (manufactured by Shimadzu Seisakusho Co.). The clarity in % was calculated by the equation:

clarity, % =(1−absorbance)×100.

Example 1.

Using the CVD apparatus illustrated in FIG. 2, a gold coin of 22-karat purity after thorough degreasing and washing was flatly mounted on the substrate table 11 in the CVD chamber 1 which was evacuated through the evacuation duct 3 by means of a vacuum pump down to a pressure of 0.01 mbar followed by continuous introduction of a gaseous mixture consisting of 15% by volume of methane and 85% by volume of hydrogen from the gas inlet tube 2 at such a rate that the pressure inside the CVD chamber 1 was kept at a pressure of 0.1 mbar by the balance with the continued evacuation. After establishment of a stationary atmospheric conditions in the CVD chamber 1, the magnetron microwave oscillator 4 was energized to generate microwaves of 2450 MHz frequency with a power output of 360 watts.

The waveguide duct 5, through which the microwaves were propagated, had a rectangular cross section of 116 mm by 57 mm dimensions in the horizontal direction and vertical direction, respectively, taken at the connection with the CVD chamber 1. A microwave-barrier diaphragm 9 having an orifice 9a was provided on the border plane between the waveguide duct 5 and the CVD chamber 1. The diaphragm 9 was made from stainless steel and had a thickness of 1.4 min. The orifice 9a provided at the center of the diaphragm 9 had an elliptic form with a longer axis of 8 mm in the horizontal direction and a shorter axis of 5 mm in a vertical direction. Accordingly, the area of this orifice 9a was 0.48% of the cross sectional area of the waveguide duct 5. Apart from the diaphragm 9 by a distance of 110 mm toward the waveguide duct 5, a gas shield made from fused silica glass and having a thickness of 6 mm was provided in the waveguide duct 5 thus to define a plasma-generating zone 10 in communication with the CVD chamber by the orifice 9a.

The plasma-induced deposition of a carbonaceous film on the gold coin surface was conducted in the above described manner taking 60 minutes to complete coating of a single surface followed by turning of the coin upside down and further continued deposition of a carbonaceous film for another 60 minutes. The surface temperature of the gold coin was about 80° C. throughout the deposition procedure. The carbonaceous coating film thus deposited on the surface of the gold coin had a thickness of 0.1 μm.

The results of the evaluation tests were that absolutely no changes were found in the surface conditions of the sample and appearance of scratches could not be detected in the testing items of abrasion resistance, weatherability, ultraviolet resistance, heat cycle test and solvent resistance. The data obtained in the tests for the hardness, luster and clarity are shown in Table 1 below.

Example 2.

The experimental procedure was substantially the same as in Example 1 except that, instead of the gold coin, a facetted ruby stone was mounted on the substrate table 11 and coated with a superhard carbonaceous film having a thickness of 0.2 μm. The time taken for the treatment was 60 minutes. The temperature of the substrate surface during the treatment was 80° C.

The results of the evaluation tests for the thus coated ruby stone were as good as in Example 1. The data obtained in the tests for the hardness, luster and clarity are shown in Table 1 below.

Example 3.

The experimental procedure was substantially the same as in Example 1 except that, instead of the gold coin, a contact lens of polymethyl methacrylate resin was mounted on the substrate table 11 and coated on one surface with a superhard carbonaceous film having a thickness of 0.03 μm. The time taken for the treatment was 20 minutes. The temperature of the substrate surface during the treatment was 80° C.

The results of the evaluation tests for the thus coated contact lens were as good as in Example 1. The data obtained in the tests for the hardness, luster and clarity are shown in Table 1 below.

Example 4.

The experimental procedure was substantially the same as in Example 1 except that the aperture ratio of the elliptic orifice 9a in the microwave-barrier diaphragm 9 was increased from 0.48% to 0.67% of the cross sectional area of the waveguide duct 5. A carbonaceous protective coating film having a thickness of 0.15 μm was formed after 60 minutes of the treatment time. The maximum temperature of the substrate surface was 135° C. during this period but no adverse influences were noted in the substrate gold coin.

The results of the evaluation tests for the thus coated platinum ring were as good as in Example 1. The data obtained in the tests for the hardness, luster and clarity are shown in Table 1 below.

Example 5.

The experimental procedure was substantially the same as in Example 1 except that the elliptic orifice 9a in the microwave-barrier diaphragm 9 had a longer axis of 8.0 mm in the horizontal direction and a shorter axis of 7.5 mm in the vertical direction with an aperture ratio of 0.71% relative to the cross section of the waveguide duct 5, and the substrate article subjected to the coating treatment was a platinum ring after thorough degreasing and washing. The thickness of the carbonaceous coating film thus obtained by the treatment for 60 minutes was 0.12 μm. The maximum temperature of the substrate surface was 200° C. during this period but no adverse influences were noted in the substrate platinum ring.

The results of the evaluation tests for the thus coated platinum ring were as good as in Example 1. The data obtained in the tests for the hardness, luster and clarity are shown in Table 1 below.

Comparative Example

The procedure of the experiment using the same 22-karat gold coin as the substrate was substantially the same as in Example 1 except that the CVD apparatus had no microwave-barrier diaphragm as illustrated in FIG. 1 and the gaseous mixture introduced into the CVD chamber consisted of 3% by volume of methane and 97% by volume of hydrogen. The carbonaceous coating film formed on the gold coin surface by a 60 minutes treatment had a thickness of 0.4 μm. The temperature of the gold coin surface during the treatment was 780° C., lower by 330° C. than the melting point 1064° C. of 22-karat gold but no particular adverse influences were caused in the gold coin per se.

The results of the evaluation tests were as good as in Example 1 for the items of abrasion resistance, weatherability, ultraviolet resistance, heat cycle test and solvent resistance. This coating procedure, however, was found not practical because a considerably large crack was found in the carbonaceous coating film and, in some cases, microscopic precipitates were detected in the coating film which were presumably discrete microcrystals of diamond. The data obtained in the tests for the hardness, luster and clarity are shown in Table 1 below, from which it is understood that the luster and clarity of the coating film are remarkably low as compared with the results in the preceding Examples although the Vickers microhardness was better than in Example 1.

TABLE 1

|  | Vickers microhardness, kgf/mm$^2$ | Luster, % | Clarity, % |
| --- | --- | --- | --- |
| Example 1 | 3000 | −1.8 | 99 |
| Example 2 | 3000 | −0.7 | 99 |
| Example 3 | 3000 | −1.8 | 99 |
| Example 4 | 5000 | +0.2 | 99 |
| Example 5 | 5500 | +0.1 | 97 |
| Comparative Example | 8000 | −27.0 | 69 |

What is claimed is:

1. In a method for forming a superhard carbonaceous coating film on the surface of an article by the plasma-induced chemical vapor-phase deposition (CVD) process in an apparatus comprising a microwave oscillator to generate microwaves, a plasma-induced CVD chamber into which a hydrocarbon compound in a gaseous form is introduced and plasma of the gas is generated to effect deposition of a carbonaceous film on the surface of an article, and a waveguide duct partitioned from the CVD chamber by a gas-shield, through which the microwaves generated in the microwave oscillator are introduced into the CVD chamber, the improvement which comprises providing a microwave-barrier diaphragm having an orifice between the gas shield in the waveguide duct and the CVD chamber to form a plasma-generating zone therebetween so as to limit the microwaves directly entering the CVD chamber.

2. The improvement as claimed in claim 1 in which the microwave-barrier diaphragm is made from stainless steel.

3. The improvement as claimed in claim 1 in which the microwave-barrier diaphragm has a thickness in the range from 1 mm to 5 mm.

4. The improvement as claimed in claim 1 in which the orifice in the microwave-barrier diaphragm has an area which is in the range from 0.1% to 1.2% of the cross sectional area of the waveguide duct.

5. The improvement as claimed in claim 1 in which the orifice in the microwave-barrier diaphragm has a circular form or an elliptic form with the longer axis in the horizontal direction and the shorter axis in the vertical direction, of which the ratio of the longer axis to the shorter axis does not exceed 8:4.

6. The improvement as claimed in claim 1 in which the distance between the gas shield in the waveguide duct and the microwave-barrier diaphragm is in the range from 90 mm to 120 mm along the waveguide duct.

* * * * *